(12) United States Patent
Ishio et al.

(10) Patent No.: US 6,521,966 B1
(45) Date of Patent: Feb. 18, 2003

(54) SEMICONDUCTOR STRAIN SENSOR

(75) Inventors: Seiichiro Ishio, Kariya (JP); Inao Toyoda, Okazaki (JP); Yasutoshi Suzuki, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/547,457

(22) Filed: Apr. 12, 2000

(30) Foreign Application Priority Data

Apr. 14, 1999 (JP) ............................................. 11-106913
Feb. 23, 2000 (JP) ........................................ 2000-052163

(51) Int. Cl.$^7$ ............................................... H01L 29/82
(52) U.S. Cl. ...................... 257/417; 257/418; 257/419
(58) Field of Search ................................. 257/417, 418, 257/419

(56) References Cited

U.S. PATENT DOCUMENTS

| | | | | |
|---|---|---|---|---|
| 5,207,102 A | * | 5/1993 | Takahashi et al. | ......... 29/621.1 |
| 5,948,991 A | | 9/1999 | Nomura et al. | |
| 5,986,316 A | | 11/1999 | Toyoda et al. | |
| 6,049,120 A | | 4/2000 | Otani et al. | |
| 6,093,576 A | * | 7/2000 | Otani | ........................ 438/118 |
| 6,201,285 B1 | * | 3/2001 | Iwata et al. | ................. 257/419 |

FOREIGN PATENT DOCUMENTS

| | | | |
|---|---|---|---|
| EP | 0 552 017 | | 7/1993 |
| EP | 0 890 830 | | 1/1999 |
| JP | 5-172674 | | 7/1993 |
| JP | 9-61271 | | 3/1997 |
| JP | WO99/01771 | * | 1/1999 |
| WO | WO 96/26424 | | 8/1996 |

* cited by examiner

Primary Examiner—Nathan J. Flynn
Assistant Examiner—Leonardo Andújar
(74) Attorney, Agent, or Firm—Law Offices of David G. Posz

(57) ABSTRACT

A semiconductor strain sensor in which a sensor element for detecting a strain signal is mounted in a resin package member, which can restrain a creep stress of the package member from affecting to the sensor element. A semiconductor strain sensor is provided with a lead frame integrally molded with a resin package member, and a sensor chip made of silicon. The sensor chip is mounted on one surface of an element mounting portion of the lead frame, and is capable of externally outputting electric signal via a wire in accordance with strain when pressure is applied. An opening portion is provided in the package member, so that the entire area of another surface of the lead frame, where positions beneath the sensor chip, is non-contacted with the package member. Since another surface of the lead frame is non-contacted with the package member at the opening portion, even if the creep occurs in the package member, it can prevent stress (creep stress) undergone in accordance with the creep deformation from being transferred to the sensor chip.

10 Claims, 5 Drawing Sheets

SEMICONDUCTOR STRAIN SENSOR

CROSS REFERENCE TO RELATED APPLICATION

This application is based upon Japanese Patent Application Nos. Hei. 11-106913 filed on Apr. 14, 1999, and 2000-52163 filed on Feb. 23, 2000, the contents of which are incorporated herein by reference.

BACKGROUND OF THE INVENTION

1. Field of the Invention

This invention relates to semiconductor strain sensors, and particularly to a semiconductor strain sensor in which a sensor element (sensor chip) is mounted on a lead frame fixed to a resin package member, and is applicable to a high pressure sensor such as an intake pressure sensor or a brake oil pressure sensor for a vehicle.

2. Related Art

Conventionally, this kind of semiconductor strain sensors has proposed in, for example, JP A 9-61271 or JP A 5-172674. According to these semiconductor strain sensors, a lead frame is molded by a resin package member so that both main and back surfaces of the lead frame are covered with the package member, and a sensor element (sensor chip), which is made of silicon and is capable of converting a strain while external stress (pressure or acceleration) is applied into an electric signal is mounted on the lead frame by using resin adhesive.

In a case of pressure detection, for example, when pressure (e.g., intake pressure of a combustion engine or brake oil pressure for a vehicle) is applied to the sensor element from a target medium to be measured, the sensor element strains so that an electric signal in proportion to the strain (hereinafter, called "strain signal") is outputted from the sensor element. The strain signal outputted from the sensor element is externally outputted from a lead frame through a bonding wire.

In the conventional structure, thermal expansion coefficients of the sensor element, the lead frame and a package set are set to similar values for the purpose of reducing thermal stress to be applied to the sensor element to secure a sensor characteristic. However, thermal hysteresis, in which the sensor characteristic changes from an initial characteristic as a result of a cooling-heating cycle that repeats low temperatures and high temperatures, will occur even in such a structure.

FIG. 7 shows a diagram illustrating the thermal hysteresis. In this figure, a horizontal axis (shown by dotted line) indicates time, a left vertical axis indicates sensor outputs (strain signal) (shown by solid line), and a right vertical axis indicates device temperatures.

The thermal hysteresis is a difference between former sensor outputs at a room temperature (e.g., 25° C.) and latter sensor outputs at the room temperature after passing a high temperature process (e.g., 120° C.). In other words, the thermal hysteresis is a phenomenon in which the sensor outputs at the room temperature after passing the high process are changed with time.

According to the consideration, this phenomenon occurs due to the following reason. An initial stress while the lead frame is being molded with a package member or a difference of thermal expansion coefficients between each member occurs as a contortion as a result of the thermal process. A creep is undergone in the resin, which constitutes the package member. In the sensor element after passing the thermal process, stress (hereinafter, called "creep stress") due to the creep deformation of the package member is applied to the sensor element, unlike an initial condition before the thermal process. Therefore, an output (strain signal) characteristic of the sensor element changes, and therefore the thermal hysteresis occurs.

Furthermore, in a case where the sensor element and the lead frame are fixed to each other via resin adhesive, the creep stress of the package member is also applied to the adhesive, and creep also occurs in the resin constituting the adhesive. The creep stress in the adhesive also affects the sensor element.

This problem that a sensor characteristic changes due to a creep stress, which is undergone in a resin constituting a package, is a common problem for semiconductor strain sensors in which a sensor element for detecting a strain signal is mounted in a resin package member.

SUMMARY OF THE INVENTION

This invention has been conceived in view of the background thus far described and its first object is to prevent creep stress of a package member from affecting a sensor element.

Its second object is to provide a semiconductor strain sensor in which a sensor element for detecting a strain signal is mounted in a resin package member and which can prevent creep stress from the package member from affecting the sensor element.

According to the present invention, a lead frame has one surface for mounting a sensor element and another surface, and is supported by a package member. The package member has a space portion on a side of the another surface of the lead frame. The space portion is formed so that at least one area of a mounting area where the sensor element is mounted in the another surface of the lead frame is non-contacted with the package member at the space portion. Due to the existence of the space portion, even if the creep occurs in the package member, creep stress is prevented from being transferred to the sensor element.

According to another aspect of the present invention, a sensor element is contained in a resin package member via an element mounting member, which has a thermal expansion coefficient closer to that of the sensor element than that of the resin constituting the package member. Due to the existence of the element mounting member having such a characteristic, thermal stress due to a difference in the thermal expansion coefficient between the sensor element and the package member can be prevented, and therefore creep in the package member can be prevented. As a result, creep stress in the package member can be prevented from affecting to the sensor element.

BRIEF DESCRIPTION OF THE DRAWINGS

These and another objects, features and characteristics of the present invention will be appreciated from a study of the following detailed description, the appended claims, and drawings, all of which form parts of this application. In the drawings, same portions or corresponding portions are put the same numerals each other to eliminate redundant explanation. In the drawings:

DESCRIPTION OF THE PREFERRED EMBODIMENTS

First Embodiment

Figure 1:
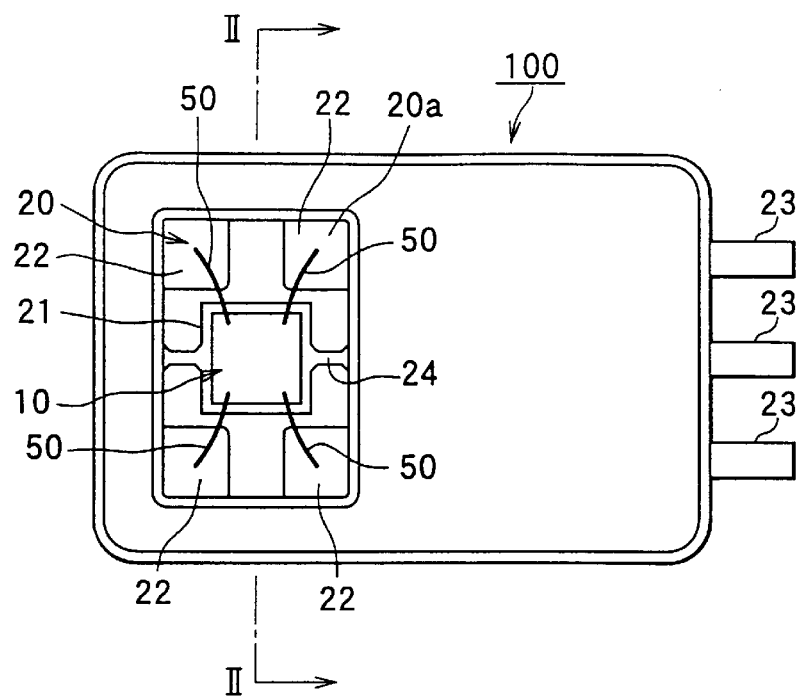
FIG. 1 is a plan view of a semiconductor strain sensor of a first embodiment according to the present invention.
Figure 2:
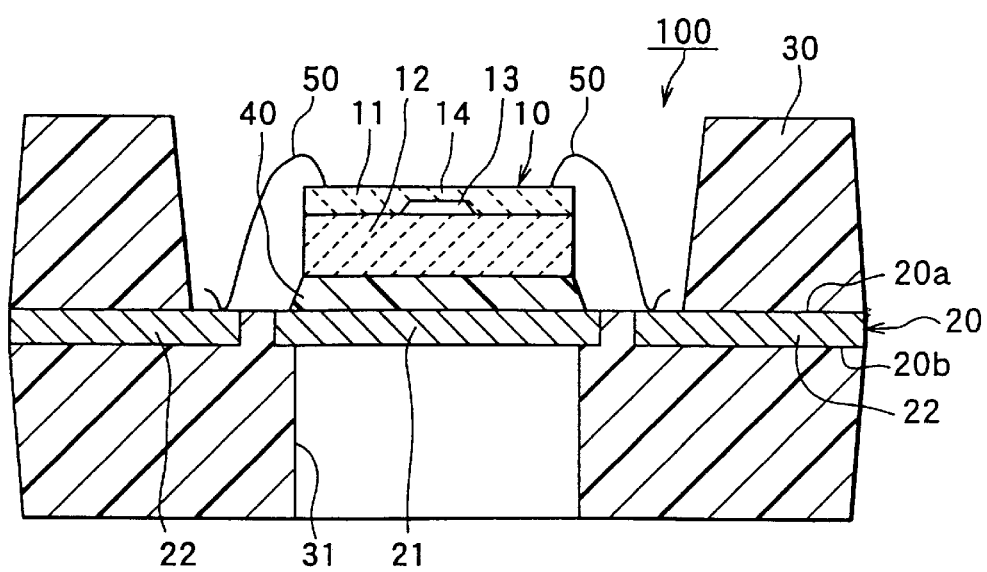
FIG. 2 is a sectional view of the semiconductor strain sensor taken along a II—II line in FIG. 1.

FIG. 1 is a plan view illustrating an entire structure of a semiconductor strain sensor 100 of a first embodiment, and FIG. 2 is a sectional view taken along a line II—II in FIG. 1. This semiconductor strain sensor 100 is applicable, for example, to an intake pressure sensor for being provided in an intake line in a combustion engine of a vehicle so as to detect intake pressure therein. In this case, the intake pressure sensor is provided, for example, by being contained in a case, which can be connected to a pipe of the intake line.

A sensor chip (sensor element) 10 is made up of a silicon substrate 11 in which a cavity is formed and a silicon substrate 12, which is bonded with the silicon substrate 11 with a silicon oxide film interposed therebetween. A pressure reference chamber 13 is formed therein by using the cavity as an internal space. The pressure reference chamber 13 is kept to a constant pressure under 1 kPa, for example, by bonding the silicon substrates 11 and 12 in a reduced pressure chamber.

In the sensor chip 10, a diaphragm 14 is formed in the silicon substrate 11 where corresponds to the pressure reference chamber 13, and gage resistors are formed on the diaphragm 14 to form a bridge circuit. When external stress such as the intake pressure acts on the diaphragm 14, the diaphragm is strained and deformed, and the strain or the deformation of the diaphragm is outputted as an electric signal via the bridge circuit.

A lead frame 20 is formed by stamping a plate made of, for example, 42-alloy (42% Ni—Fe alloy). The lead frame 20 is provided with an element mounting portion 21 to be exposed through a depression portion formed in a package member 30 formed by molding epoxy-based resin or the like, a lead portion 22, and a terminal portion 23, which is electrically connected to the lead portion 22 and is led to a surrounding portion of the package member 30. The lead frame 20 is integrally formed with the package member 30 and supported by the package member 30 by molding one surface (upper surface in FIG. 2) 20a and another surface 20b (opposite surface of the one surface 20a) with the package member 30.

The element mounting portion 21 is formed in a plate shape having an area for mounting the sensor chip 10. The sensor chip 10 is mounted on a surface, which corresponds to the one surface 20a, of the element mounting portion 21 via an adhesive 40. The adhesive 40 is selected from resin adhesive (e.g., silicon-based adhesive) having a Young's modulus equal to or lower than 10 MPa, so that a creep due to the thermal process can be restrained from occurring in the adhesive 40.

The lead frame 22 is electrically connected to the bridge circuit of the sensor chip 10 through a wire 50. The terminal portion 23 is electrically connected to an external circuit (e.g., ECU of the vehicle) through an adequate wire member. In this way, the electric signal from the sensor chip 10 can be externally outputted through the wire 50, the lead portion 22, and the terminal portion 23.

Figure 3:
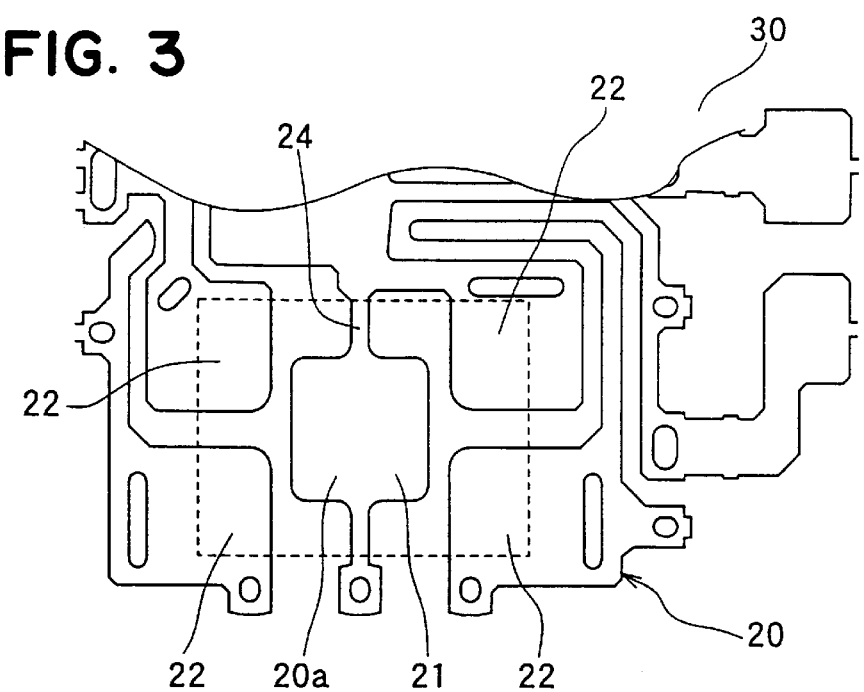
FIG. 3 is a diagram illustrating an example of a detailed shape of a lead frame.

FIG. 3 shows an example of a structure of the lead frame 20 around the element mounting portion 21. A dotted line in this figure shows an outline of the depression portion of the package member 30 for exposing the element mounting portion 21 and the lead portion 22. The element mounting portion 21 is connected to the portion, which is continuously formed with the lead frame 22, via a suspension pin portion 24. Each of the portions 21–24 of the lead frame 20 is integrally formed each other.

Here, in this embodiment, an opening portion 31 (space portion) is formed in the package member 30, so that an entire area of a particular portion of another surface 20b of the lead frame corresponds to a portion at which the sensor chip 10 is mounted (another surface 20b positioned beneath the sensor chip 10 as shown in FIG. 2). As a result, the entire area of the particular portion of another surface 20b of the lead frame 20 positioned beneath the sensor chip 10 is non-contacted (does not contact with) the package member.

As shown in FIG. 2, the element mounting portion 21 is supported by the package member 30 at a peripheral portion thereof, which positions outer peripheral portion of a mounting area where the sensor chip 10 is mounted. Here, there is no problem when the entire area of the particular portion of another surface 20b of the lead frame 20, where positions beneath the sensor chip 10, are exposed, because the element mounting portion 21 is supported by the package member 30 via the suspension pin portion 24.

Figure 4:
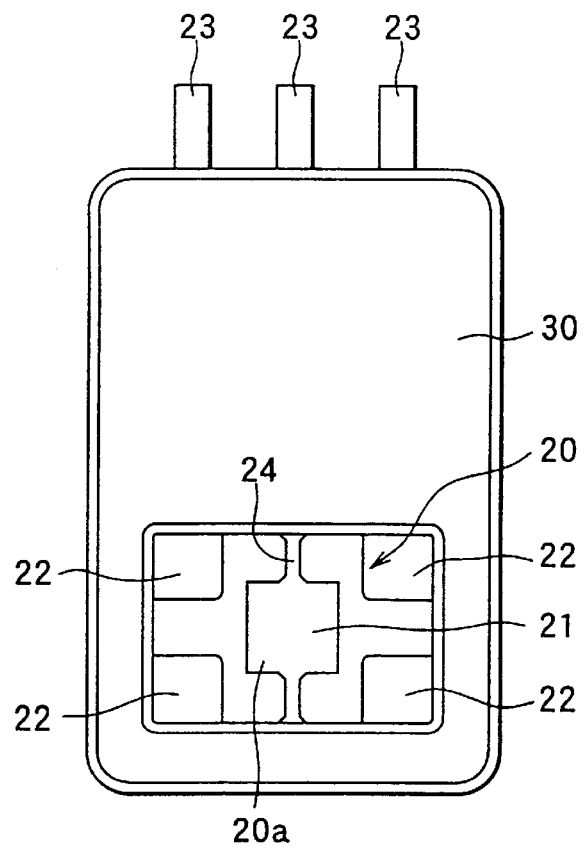
FIG. 4 is a plan view illustrating a structure body formed by assembling a package member and the lead frame.

The semiconductor strain sensor 100 can be manufactured as follows. The lead frame 20 is fixed in a die having a shape corresponding to the package member 30. An integrated structure as shown in FIG. 4 is formed by integrating the package member 30 and the lead frame 20. The sensor chip 10 is fixed to the element mounting portion 21 of the structure by using the adhesive 40. Finally, the wire or the like is connected by using a wire bonding or the like.

According to this embodiment, since another surface 20b of the lead frame 20 is non-contacted with the package member 30 at the opening portion 31, even if the creep occurs in the package member 30, it can prevent stress (creep stress) undergone in accordance with the creep deformation from being transferred to the sensor chip 10.

Therefore, it can also prevent the occurrence of the creep in the adhesive 40 due to the creep stress in the package member 30, and can reduce the thermal hysteresis. As a result, it can provide a semiconductor strain sensor, which can realize a stable sensor output (initial performance) even if the semiconductor strain sensor is exposed to the cooling-heating cycle.

Here, in FIG. 2, the opening portion (space portion) 31 is formed so that the entire area of the particular portion of another surface 20b of the lead frame, where corresponds to the portion at which the sensor chip 10 is mounted, are exposed. However, the space portion may be modified as shown in FIGS. 5A–5D.

Figure 5A:
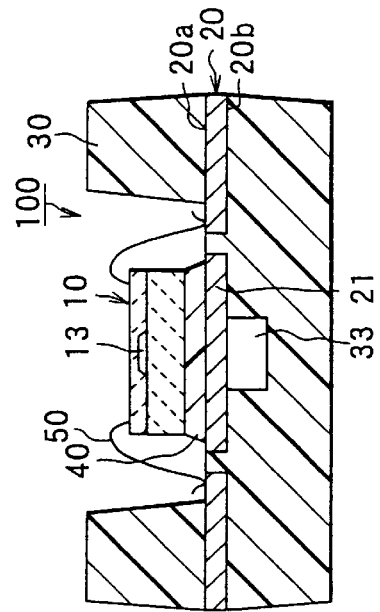
FIGS. 5A–5D are sectional views respectively illustrating a spacing portion of the present invention.
Figure 5B:
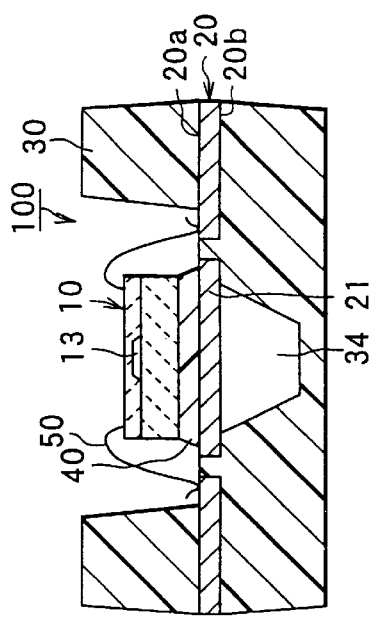
Figure 5C:
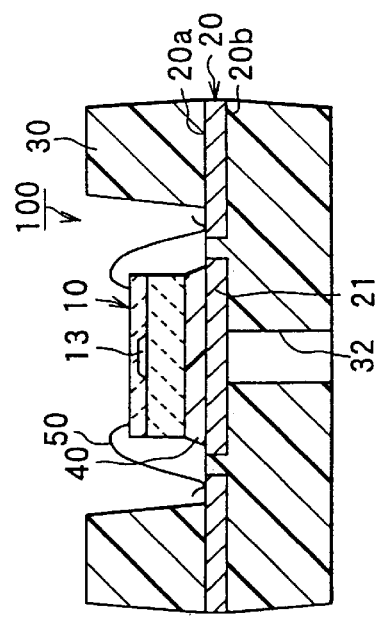
Figure 5D:
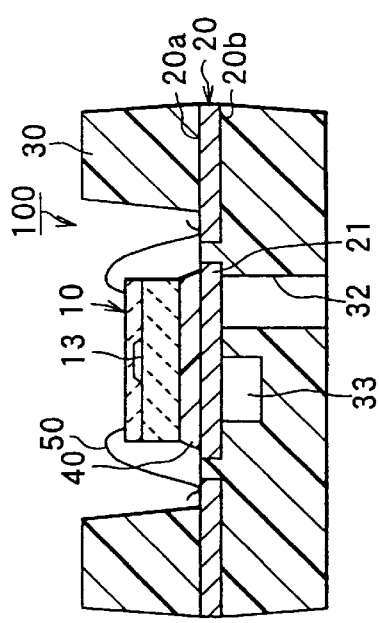

That is, as shown in FIGS. 5A and 5B, an internal space 33 may be formed in the package member 30, so that parts of anther surface 20b positioned beneath the sensor chip 10 is not contacted with the package portion 30. As shown in FIG. 5C, the space portion maybe formed by combining the opening portion 32 and the internal space 33. Furthermore, as shown in FIG. 5D, an internal space 34 may be formed, so that an entire area of anther surface 20b positioned beneath the sensor chip 10 is not contacted with the package portion 30.

These space portions 32–34 can be also formed during the molding of the package member 30, and can prevent the creep stress of the package member 30 from being transferred to the sensor chip 10. Here, when the entire area of anther surface 20b positioned beneath the sensor chip 10 is not contacted with the package portion 30 as shown in FIGS. 2 and 5D, the creep stress can be further restrained from being transferred to the sensor chip 10 compared to the case where the parts of anther surface 20b positioned beneath the sensor chip 10 is not contacted, because the total area to be contacted with the package portion 30 is small.

According to this embodiment, since the resin adhesive having a Young's modulus equal to or lower than 10 MPa is used for bonding the sensor chip 10 to the element mounting portion 21 of the lead frame 20, the creep due to the thermal process can be restrained from occurring in the adhesive 40.

In this embodiment, the thermal stress applied to the sensor chip 10 can be further reduced by setting thermal expansion coefficient of the lead frame 20 larger than that of the sensor chip 10, and by setting the thermal expansion coefficient of the package member 30 larger than that of the lead frame 20. For example, when the sensor chip 10 is formed by silicon (thermal expansion coefficient: $2 \times 10^{-6}$–$3 \times 10^{-6}/°$ C.), the lead frame 20 is formed by the 42-alloy (thermal expansion coefficient: $4 \times 10^{-6}$–$5 \times 10^{-6}/°$ C.), the package member 30 is formed by the epoxy resin (thermal expansion coefficient: $12 \times 10^{-6}$–$14 \times 10^{-6}/°$ C.).

Here, it is preferable to set differences between adjacent each member 10, 20, 30 small (it depends on a specification of the sensor). For example, each of the differences is preferably set to less than $1 \times 10^{-5}/°$ C., and further to less than $1 \times 10^{-6}/°$ C.

Second Embodiment

Figure 6:
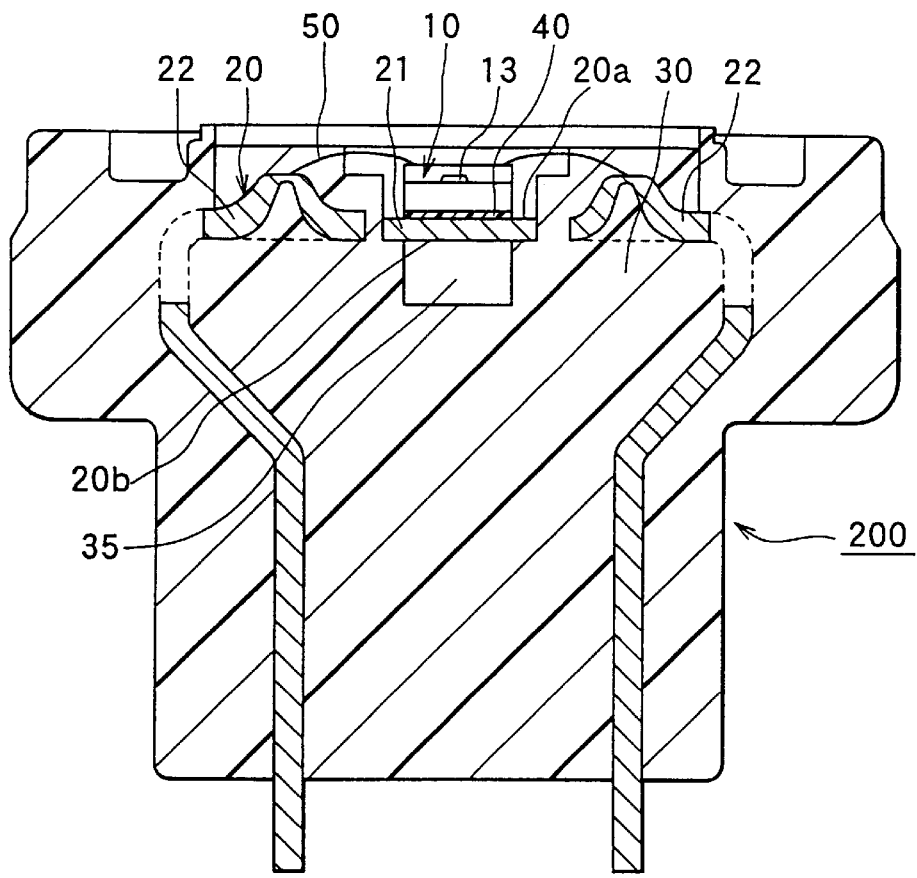
FIG. 6 is a schematic sectional view of a semiconductor strain sensor of a second embodiment according to the present invention.
Figure 7:
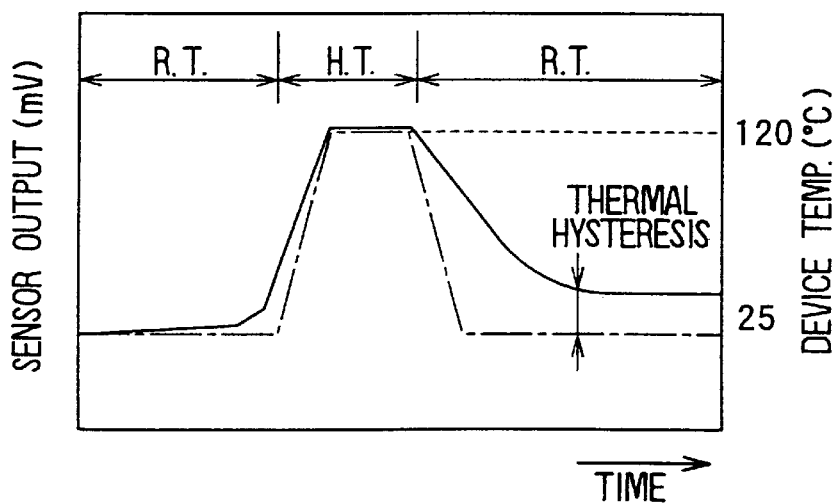
FIG. 7 is a diagram illustrating a thermal hysteresis of sensor outputs.

FIG. 6 shows a schematic sectional view of a semiconductor strain sensor 200 of a second embodiment. The semiconductor strain sensor 200 is applicable, for example, to a high-pressure sensor for detecting a brake oil pressure of a vehicle or a fuel injection pressure of an internal combustion engine.

In detail, the semiconductor strain sensor 200 is applicable to a so-called seal diaphragm type pressure detection apparatus. In this apparatus, a housing member (not-shown) having a seal diaphragm is assembled with the package member 30 at upper side, and the sensor chip 10 is air tightly sealed between the seal diaphragm and the package member 30.

The lead portion 22 of the lead frame 20 is extended from inside of the package member 30 to outside by being bent. The lead portion 22 is used as a connector pin for electrically connecting with the external circuits or the like.

An internal space 35 (space portion) is formed in the package member 30, so that an entire area of a particular portion of another surface 20b of the lead frame, where corresponds to a portion at which the sensor chip 10 is mounted (another surface 20b positioned beneath the sensor chip 10 as shown in FIG. 6). As a result, the entire area of the particular portion of another surface 20b of the lead frame 20, where positions beneath the sensor chip 10, is non-contacted with the package member 30.

Here, the internal space 35 may be downwardly extended, so as to become an opening portion. According to this embodiment, it can prevent stress (creep stress) undergone in the package member 30 from being transferred to the sensor chip 10, alike the first embodiment.

Third Embodiment

Figure 8:
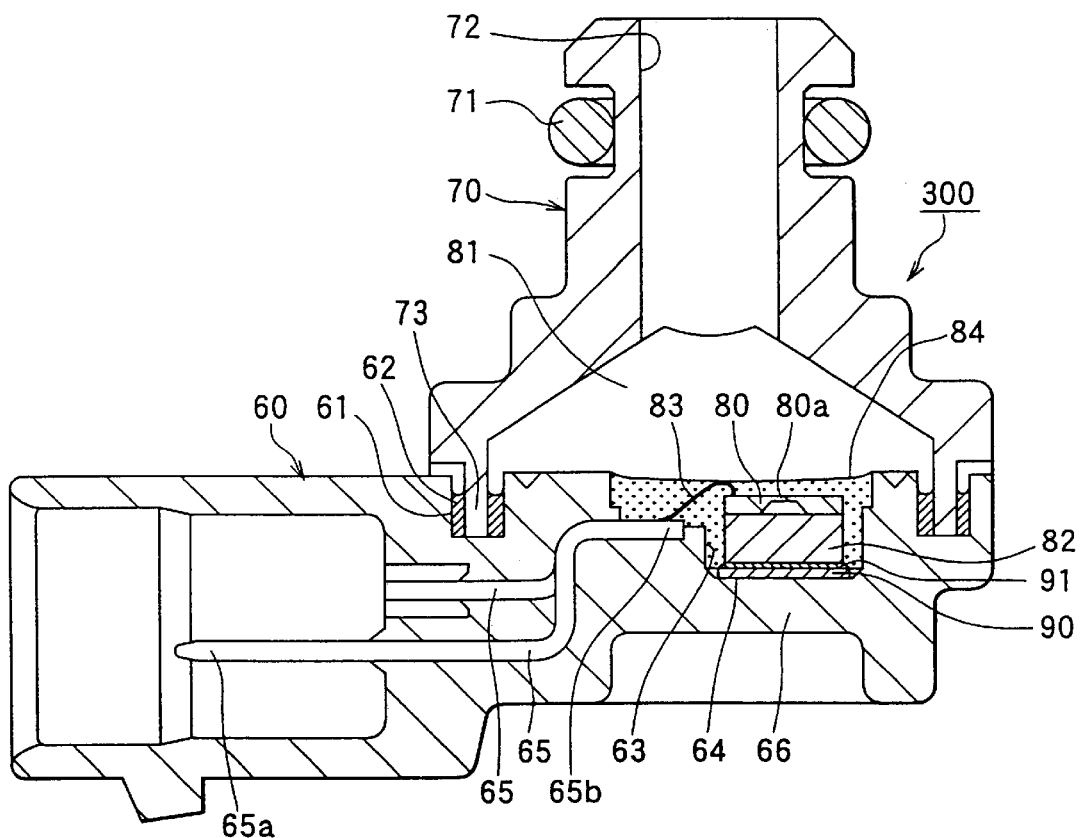
FIG. 8 is a schematic sectional view of a semiconductor strain sensor of a third embodiment according to the present invention.

FIG. 8 shows a schematic sectional view of a semiconductor strain sensor 300 of a third embodiment. The semiconductor strain sensor 300 is applicable, for example, to the intake pressure sensor or the like. A connector case 60 as the package member is made of resin such as PPS (poly phenylene sulfide) and is formed by molding the PPS.

A housing case 70 made of, for example, resin or the like is assembled to the connector case 60. The housing case 70 is mounted in a target to be measured (e.g., the intake pile of the combustion engine), and is provided with an O-ring for sealing among the target to be measured and a pressure conduction hole 72 for introducing pressure (e.g., intake pressure) from the target to be measured.

In this embodiment, the connector case 60 and the housing case 70 can be assembled and fixed each other by inserting a connection portion 73 as a protrusion formed to the housing case 70 into a depression portion 61 formed in the connector case 60, and filling up an adhesive 62 into the depression portion.

Here, a space portion 81 for containing a sensor chip (sensor element) 80 is formed by assembling the connector case 60 and the housing case 70. The space portion 81 is communicated with the pressure introduction hole 72 of the housing case 70 for introducing the pressure to be measured via the pressure introduction hole 72. The space portion 81 is sealed by the adhesive 62.

A chip containing depression portion 63 is formed inside of the connector case 60, which defines the space portion 81. A sensor ship 80 of this embodiment is contained in the chip containing depression portion 63. The sensor chip 80 uses a piezoresistance effect, and is provided with a diaphragm 80a (sensing portion) and a not-shown gage resistor (diffusion resistor), each of which is formed on the silicon substrate. When external force is applied, the diaphragm 80a is strained and an electric signal is outputted based on the strain of the diaphragm 80a.

The sensor chip 80 is supported by being bonded on a glass seat 82, which has a thermal expansion coefficient similar to that of the silicon substrate constituting the sensor chip 80. A plate 90 as an element mounting member is fixed to a bottom surface 64 of the chip containing depression portion 63.

The plate 90 is made of a particular material (in this embodiment, 42-alloy) whose thermal expansion coefficient is closer to the sensor chip (in this embodiment, silicon) 80 than the resin (in this embodiment, PPS) constituting the connector case 60. The glass seat 82 is bonded on a plate 90 via an adhesive 91 such as resin adhesive. In this way, the sensor chip 80 is fixed and supported to the bottom surface 64 of the chip containing depression portion 63 via the glass seat 82, the adhesive 91, and the plate 90.

The connector case 60 has a function to electrically connect the semiconductor strain sensor 300 with the external wire members. A terminal (signal outputting member) 65 as a connecting terminal is integrally formed with the connector case 60 by being inserted thereto. One end portion 65a of the terminal 65b is to be connected to the external wire member, and another end portion 65b is electrically connected to the sensor chip 80 by a wire 83 formed by a wire bonding.

Here, it is preferable to form the plate 90 and the terminal 65 by the same material (in this embodiment, 42-alloy). For example, the terminal can be formed as a lead portion of the lead frame and the plate 90 can be formed as an island portion (element mounting portion) of the lead frame. When both of the plate 90 and the terminal 65 are formed by the same material, these portions can be formed at the same time, if the same lead frame is formed by inserting when the plate 90 and terminal 65 are being formed in the connector case 60.

Furthermore, when the plate 90 and the terminal 65 are formed by the same materials, it is preferable from viewpoints of a simplifying a process and a simplifying a structure. Here, the plate 90 and the terminal 65 may be formed by different materials. In this case, the plate 90 may be formed by inserting to the connector case 60 or may be formed by being bonded to the bottom surface 64 of the chip containing depression portion 63 after forming the connector case 60.

In this embodiment, the chip containing depression portion 63 is depressed compared to an inside surface of the connector case 60 in which another end portion 65b of the terminal 65 is provided. Therefore, the plate 90, which is fixed to the bottom surface 64 of this chip containing depression portion 63, is arranged so that a height is different from that of another end portion (wire bonding portion) 65b of the terminal 65. Since the height is different from each other, as shown in FIG. 8, the sensor ship 80 can be positioned near another end portion 65b of the terminal 65, so that it can facilitate the wire bonding.

The chip containing depression portion 63, the sensor chip 80, and the wire bonding portion are sealed by being filled with protection gel 84 such as silicone gel or fluorine gel. As a result, the sensor chip 80 and the wire 83 can be protected, electrically insulated, and prevented from corruption. The protection gel 84 can be formed, for example, by painting in a predetermined shape and performing a thermal process to harden it.

In the connector case 60, as shown in FIG. 8, a thinner portion 66, which has a thinner thickness, is formed at a portion corresponding to the portion where the sensor chip 80 is mounted, that is the portion corresponding to the chip containing depression portion 63. As a result, the creep stress occurred in the thinner portion 66 becomes small compared to thicker portion, which surrounds the thinner portion 66.

According to the semiconductor strain sensor 300, the pressure to be measured from the target is introduced to the space portion 81 through the pressure introduction hole 72. The introduced pressure is transferred to the diaphragm 80a of the sensor chip 80 via the gel 84, so that the signal output (resistance change) is generated. The signal output is taken out to the terminal 65 from the wire 83. Then the signal output is externally led from the terminal 65 as a pressure signal, and is inputted to the external circuit, which calculates the pressure based on the pressure signal.

As described the above, according to this embodiment, the semiconductor strain sensor 300 is formed so that the sensor chip (sensor element) 80 for outputting electric signal in proportion to the strain is contained in the connector case (package member) 60 made of resin. Furthermore, a sensor chip 80 is mounted to the connector case 60 via the plate (element mounting member) 90, which has the thermal expansion coefficient closer to the sensor chip 80 than to the resin constituting the connector case 60.

Since the plate 90 having the above thermal expansion coefficient is inserted between the sensor chip 80 and the connector case 60, thermal stress due to a difference between the thermal expansion coefficients of the sensor chip 80 and the connector case 60 can be restricted from occurring. It can prevent the creep from occurring in the connector case 60. Therefore, it can prevent the creep stress in the connector case 60 from affecting to the sensor chip 80.

Here, the Young's modulus and the thermal expansion coefficient of the sensor chip 80, the glass seat 82, the adhesive 91, the plate 90, and the connector case 60 are as follows. The sensor chip 80 is made of a silicon having the Young's modulus of 200 kgf/mm$^2$ at a <110> direction and of 13300 kgf/mm$^2$ at a <100> direction, and the thermal expansion coefficient of 2.4×10$^{-6}$/° C. The glass seat 82 is made of a glass having the Young's modulus of 6080 kgf/mm$^2$, and the thermal expansion coefficient of 2.6×10$^{-6}$/° C.

The adhesive 91 is made of resin having the Young's modulus of 15 kgf/mm$^2$, and the thermal expansion coefficient of 2.7×10$^{-6}$/° C. The plate 90 is made of the 42-alloy having the Young's modulus of 14800 kgf/mm$^2$, and the thermal expansion coefficient of 4.3×10$^{-6}$/° C. The connector case 60 is made of the PPS having the Young's modulus of 890 kgf/mm$^2$, and the thermal expansion coefficient of 10.0×10$^{-6}$/° C. By setting the above, the creep stress in the connector case 60 can be restricted from affecting to the sensor chip 80.

Furthermore, according to this embodiment, the thinner portion 66 is formed in the connector case 66 at the portion corresponding to the portion where the sensor chip. 80 is mounted. Therefore, the creep stress occurs in the thinner portion 66 can be lowered than the thicker portion surrounding the thinner portion 66. As a result, the creep stress in the connector case 60 can be further restricted from affecting to the sensor chip 80.

Modification

The package member 30 of the first and second embodiments is integrally formed with the lead frame 20 by being molded. However, the package member 30 may be separately formed from the lead frame 20. That is, when the element mounting portion is separated, package member 30 is integrally formed with a portion other than the element mounting portion of the lead frame. Then the element mounting portion 21 is bonded to the package member 30 by the adhesive or the like at a portion corresponding to the space portions 30–35.

The sensor element is not limited to the sensor chip 10. The sensor element may be other semiconductor device, which strains in accordance with an external stress and outputs signal in accordance with the strain, such as a gage element or a pressure sensitive element.

Furthermore, in.the above embodiments, the semiconductor strain sensor of the present invention has explained by exemplifying the pressure detection sensor for detecting pressure as the external force such as intake pressure sensor. However, the semiconductor strain sensor of the present invention is applicable to other external force (physical quantity) sensor for detecting the external force (physical quantity) by being strained due to the external force (physical quantity), such as an acceleration sensor, which has a sensor element for detecting acceleration applied thereto.

What is claimed is:

1. A semiconductor strain sensor comprising:
   a sensor element for being strained in response to an application of an external force thereto and for outputting an electric signal in response to a strain thereof, the sensor element further including a pressure reference chamber therein, the pressure reference chamber having an internal volume that is maintained at a constant pressure;

a lead frame having one surface for mounting the sensor element, another surface opposite the one surface and a lead portion that outputs the electric signal output from the sensor element;

a package member for supporting the lead frame, and having a space portion on a side of the another surface of the lead frame the space portion being formed so that at least an area in the another surface of the lead frame is non-contacted with the package member at the space portion; and wiring for connecting the lead portion of the lead frame and the sensor element;

wherein the sensor element separates from the package member with predetermined distance without the package member on the side of the one surface of the lead frame in a direction parallel to the lead frame.

2. A semiconductor strain sensor according to claim 1, wherein the sensor element is made of a semiconductor, and the package member is made of a resin material.

3. A semiconductor strain sensor according to claim 1, wherein the space portion of the package portion is formed so that an entire area in the another surface of the lead frame is non-contacted with the package member at the space portion.

4. A semiconductor strain sensor according to claim 1, wherein the sensor element is bonded to the lead frame via a resin adhesive having a Young's modulus equal to or less than 10 MPa.

5. A semiconductor strain sensor according to claim 1, wherein a thermal expansion coefficient of the lead frame is larger than that of the sensor element, and a thermal expansion coefficient of the package member is larger than that of the lead frame.

6. A semiconductor strain sensor according to claim 5, wherein the lead frame is made of 42% Ni—Fe alloy, and the package member is made of epoxy-based resin.

7. A semiconductor strain sensor according to claim 1, wherein the sensor element is separated from the package member by a space defined therebetween.

8. A semiconductor strain sensor according to claim 1, wherein the sensor element has a first substrate and a second substrate, and the first substrate is bonded to the second substrate to form the pressure reference chamber therebetween.

9. A semiconductor strain sensor according to claim 1, wherein the space portion is isolated from the pressure reference chamber in a bonding direction of the first substrate and the second substrate.

10. A semiconductor strain sensor according to claim 1, wherein the package member is formed from a molded resin material.

* * * * *